United States Patent
Bell et al.

(10) Patent No.: US 9,053,815 B2
(45) Date of Patent: Jun. 9, 2015

(54) CIRCUIT IN DYNAMIC RANDOM ACCESS MEMORY DEVICES

(71) Applicant: NANYA TECHNOLOGY CORPORATION, Tao-Yuan Hsien (TW)

(72) Inventors: Debra Bell, Dallas, TX (US); Kallol Mazumder, Plano, TX (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 101 days.

(21) Appl. No.: 13/903,376

(22) Filed: May 28, 2013

(65) Prior Publication Data

US 2014/0355361 A1    Dec. 4, 2014

(51) Int. Cl.
   *G11C 7/00*  (2006.01)
   *G11C 11/4076*  (2006.01)
   *G11C 7/10*  (2006.01)

(52) U.S. Cl.
   CPC .......... *G11C 11/4076* (2013.01); *G11C 7/1018* (2013.01)

(58) Field of Classification Search
   USPC ................................................. 365/189.011
   See application file for complete search history.

(56) References Cited

U.S. PATENT DOCUMENTS

| | | | | |
|---|---|---|---|---|
| 2001/0021140 A1* | 9/2001 | Fujioka et al. | ........... | 365/230.06 |
| 2008/0061852 A1* | 3/2008 | Sichert et al. | ................. | 327/161 |
| 2011/0141795 A1* | 6/2011 | Matsuzaki et al. | ............ | 365/149 |
| 2012/0092945 A1* | 4/2012 | Morgan | ........................ | 365/194 |
| 2012/0159061 A1* | 6/2012 | Hampel et al. | ................. | 711/105 |
| 2013/0201751 A1* | 8/2013 | Suzuki et al. | ................. | 365/149 |
| 2013/0205100 A1* | 8/2013 | Sato et al. | ..................... | 711/149 |
| 2013/0272079 A1* | 10/2013 | Morgan | ........................ | 365/194 |

* cited by examiner

*Primary Examiner* — Hoai V Ho
*Assistant Examiner* — Pablo Huerta
(74) *Attorney, Agent, or Firm* — WPAT, P.C.; Anthony King; Kay Yang

(57) ABSTRACT

A circuit in dynamic random access memory devices includes a command extension circuit. The command extension circuit is configured to generate at least one multiple-cycle command signal by lengthening a single-cycle clock command signal from a command decoding circuit. Control logic extends and reduces the multiple-cycle command signal to provide additional functions such as burst length and burst chop. Additional control logic is configured to determine whether a clock signal is enabled in output control logic circuitry according to the multiple-cycle command and logic level generated in the output logic circuitry.

7 Claims, 5 Drawing Sheets

CIRCUIT IN DYNAMIC RANDOM ACCESS MEMORY DEVICES

FIELD OF THE INVENTION

The present invention relates to a circuit and, in particular, to a circuit for command generation and clock control in dynamic random access memory devices and method thereof.

DISCUSSION OF THE BACKGROUND

In current DRAM, for gapless read/write, a single-cycle command pulse would be generated and propagate through the DRAM. However, since the command pulse is single-cycle wide, the command logic of the DRAM would run continuously for gapless access and the power consumption of the DRAM would be extremely high.

Therefore, in order to reducing the power consumption of the DRAM, area saving and ensure outputs and termination are enabled correctly, a circuit for command generation and clock control in DRAM devices and method thereof is necessary.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

SUMMARY

In accordance with one embodiment of the present invention, a circuit for command generation in dynamic random access memory devices comprises a command extension circuit and a first And circuit. The command extension circuit is configured to generate at least one multiple-cycle command signal by lengthening a single-cycle command signal from a command decoding circuit. Then, the at least one multiple-cycle command signal is outputted to a delay lock loop (DLL) circuit.

The first And circuit is configured to determine whether a clock signal is allowed to be sent to an output control logic circuit according to a logic level, generated by the DLL circuit or the command decoding circuit. The DLL circuit is disposed between the command extension circuit and the output control logic circuit.

In accordance with one embodiment of the present invention, a method for clock control in dynamic random access memory devices comprises the steps of transitioning a logic level according to availability of an active zone of a dQ-enable-delay (QED) shifter stack, or whether a gap command signal is received; calculating the logic level with a logic level of a clock signal and generating a result; and enabling or disabling the clock signal according to the result.

In order to provide further understanding of the techniques, means, and effects of the current disclosure, the following detailed description and drawings are hereby presented, such that the purposes, features and aspects of the current disclosure may be thoroughly and concretely appreciated; however, the drawings are provided solely for reference and illustration, without any intention to be used for limiting the current disclosure.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

Figure 1:
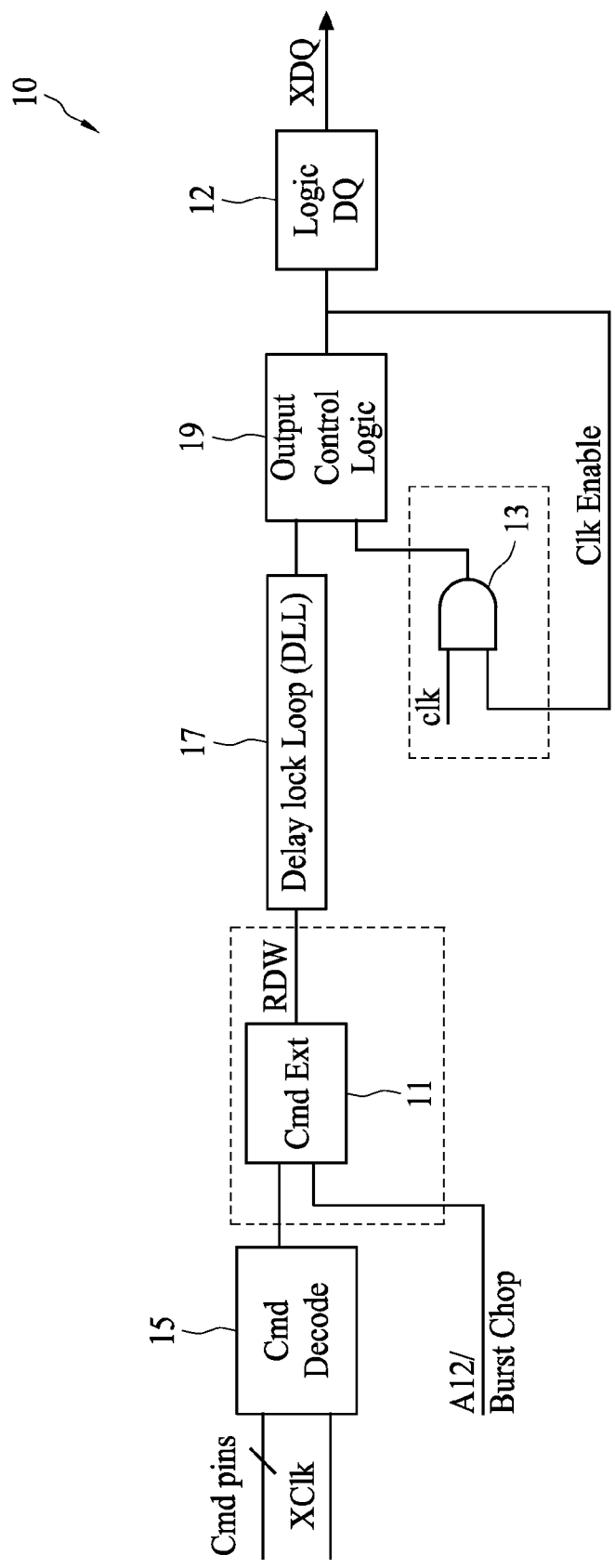
FIG. 1 shows a schematic view of a circuit for command extension and clock control in dynamic random access memory devices of one embodiment of the present invention.

FIG. 1 is a schematic view of a circuit 10 for clock control in dynamic random access memory devices of one embodiment of the present invention.

As shown in FIG. 1, the circuit 10 comprises a command extension circuit 11, a first And circuit 13, a command decoding circuit 15, a delay lock loop (DLL) 17, an output control logic 19 and a DQ logic circuit 12. The command extension circuit 11 is configured to generate at least one multiple-cycle command signal by lengthening a single-cycle command signal from the command decoding circuit 15. Then, the at least one multiple-cycle command signal is outputted to later control logic, for example, a delay lock loop (DLL) circuit 17.

The first And circuit 13 is configured to determine whether a clock signal is allowed to be sent to the output control logic circuit 19, which is according to a logic level generated by the command decoding circuit 15 or the DLL circuit 17 and outputted from the output control logic circuit 19.

Figure 2:
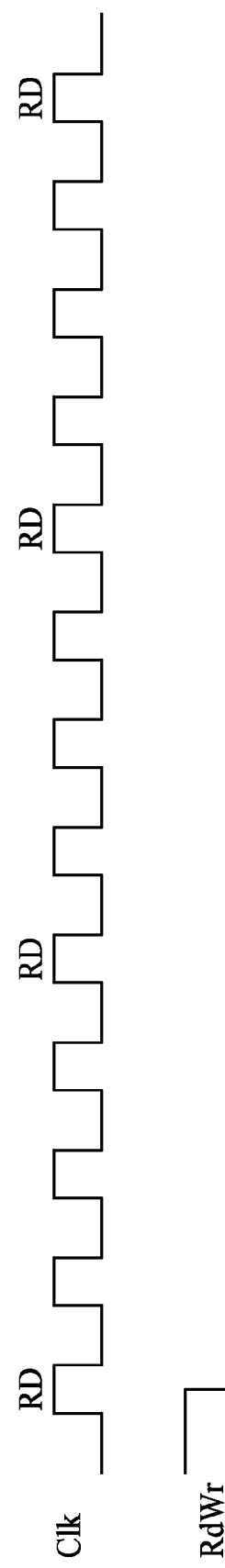
FIG. 2 shows a schematic view of a multiple-cycle command and clocks of one embodiment of present invention.

FIG. 2 shows a schematic view of a multiple-cycle command and clocks of one embodiment of the present invention. As shown in FIG. 2, in the current embodiment, the multiple-cycle command signal is corresponding to four clocks but is not limited.

Figure 3:
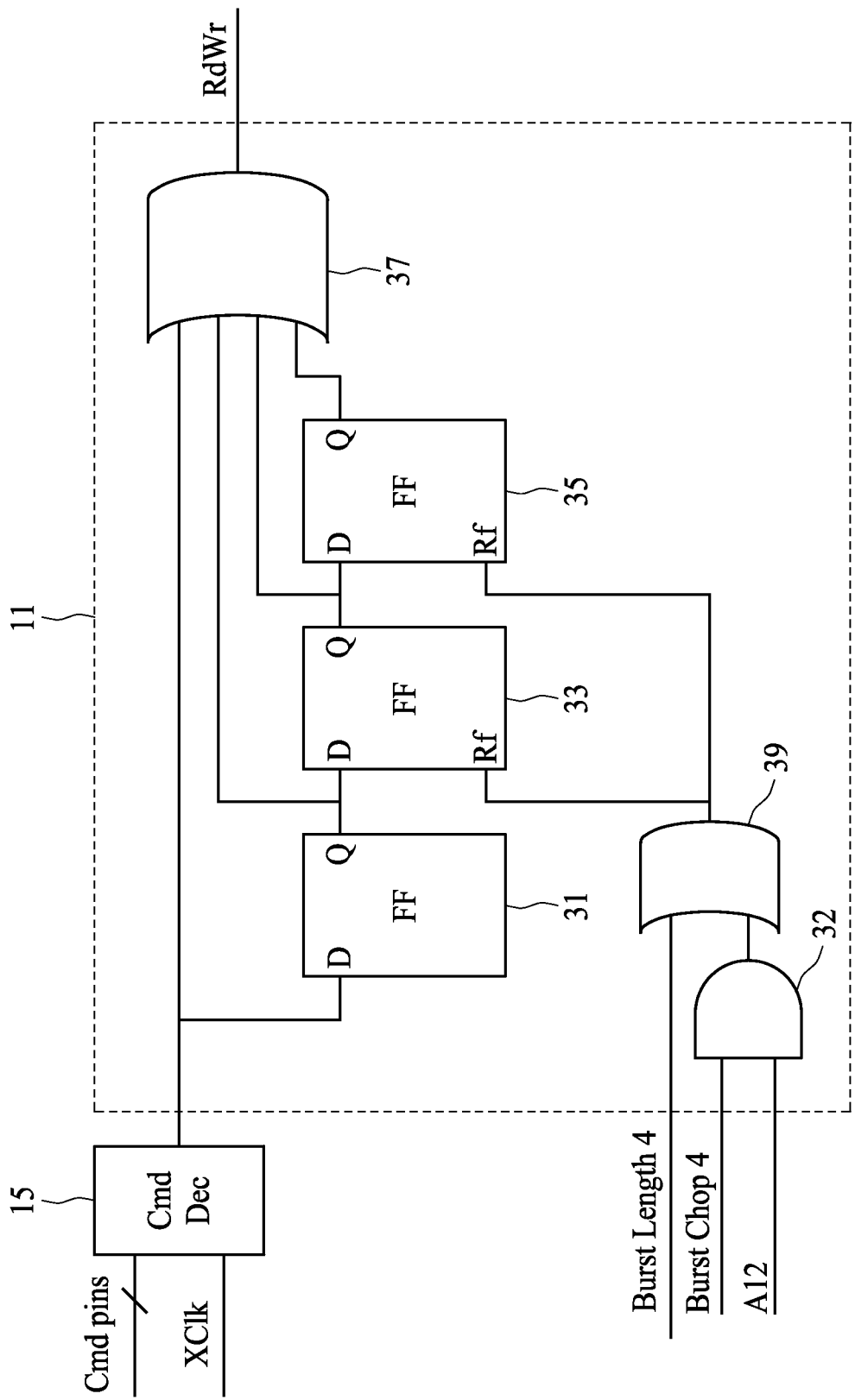
FIG. 3 shows a schematic view of a command extension circuit of one embodiment of the present invention.

FIG. 3 shows a schematic view of a command extension circuit of one embodiment of the present invention.

As shown in FIG. 3, the command extension circuit 11 further comprises a first flip-flop 31, a second flip-flop 33, a third flip-flop 35, a first Or circuit 37, a second Or circuit 39 and a second And circuit 32.

The first flip-flop 31 is coupled to the command decoding circuit 15, the second flip-flop 33 and the first Or circuit 37 respectively, wherein the first flip-flop 31 generates a first delay signal according to the single-cycle command signal from the command decoding circuit 15 and then sends the first delay signal to the second flip-flop 33 and the first Or circuit 37.

The third flip-flop 35 is coupled to the second Or circuit 39, the second flip-flop 33 and the first Or circuit 37 respectively, wherein the third flip-flop 35 generates a third delay signal according to a second delay signal from the second flip-flop 33 and a reset signal from a second Or circuit 39 and then sends the third delay signal to the first Or circuit 37.

Moreover, the second delay signal is generated by the second flip-flop 33 according the first delay signal and the reset signal. The reset signal is generated by the second Or circuit 39 according to a burst length 4 signal and an output signal from the second And circuit 32. The second And circuit 32 generates its output signal according to a A12 signal and a burst chop 4 signal, and the first Or circuit 37 is configured to generate its output signal (the multiple-cycle command signal) to the DLL circuit 17 according to the first delay signal of the first flip-flop 33, the second delay signal of the second flip-flop 35, the third delay signal of the third flop-flip 37 and the single-cycle command signal of the command decoding circuit 15.

Moreover, the output control logic 19 further comprises a QED shifter stack, wherein the QED shifter stack comprises a plurality of shifters, wherein the active zone comprises a portion of the shifters.

Figure 4:
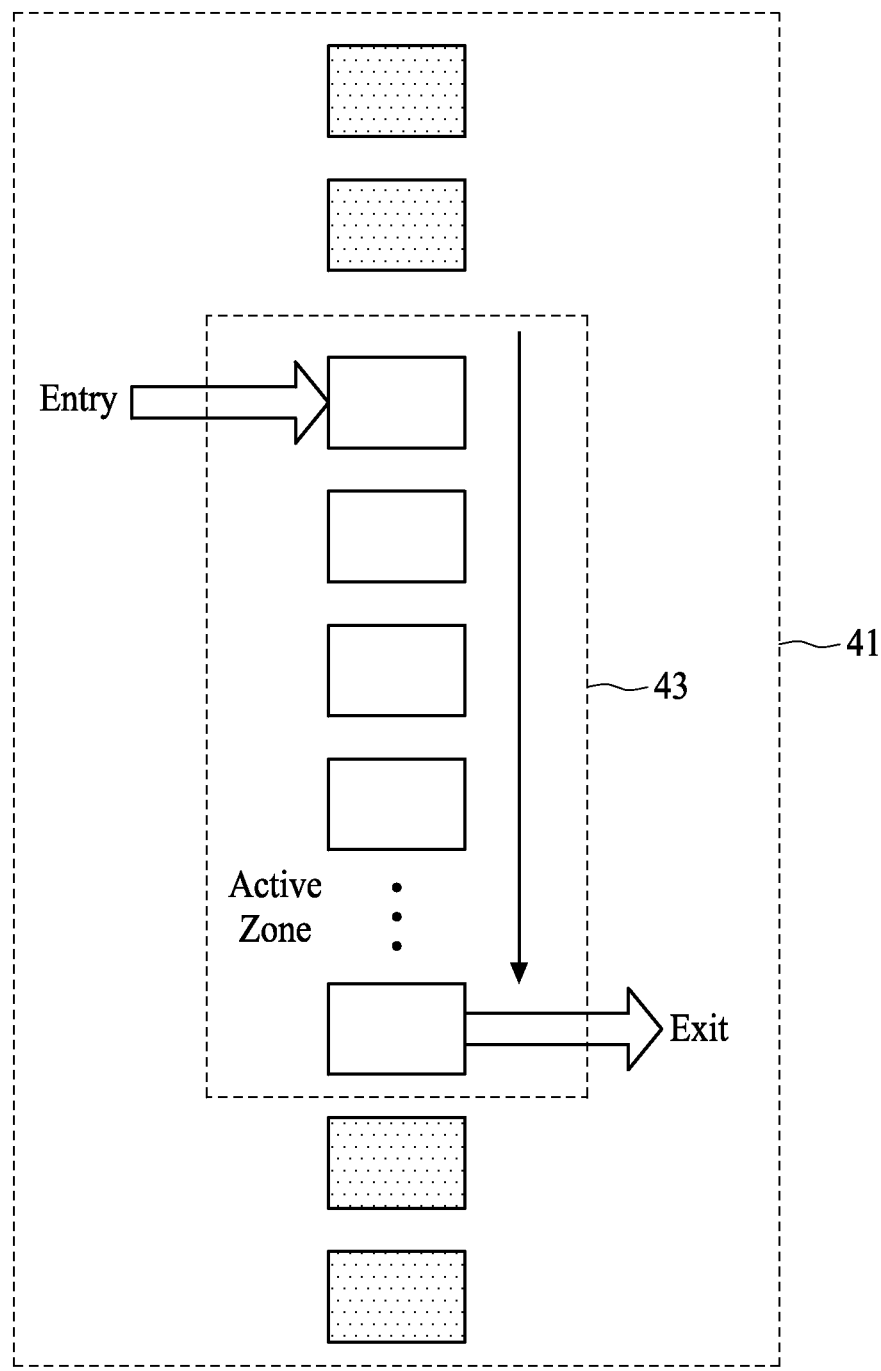
FIG. 4 shows a schematic view of an active zone of one embodiment of the present invention.

FIG. 4 shows a schematic view of the QED shifter stack of the output control logic circuit. As shown in FIG. 4, the QED shifter stack 41 comprises of the shifters. The active zone 43 comprises of the portion of the shifters. Furthermore, a first-in-first-out (FIFO) algorithm is implemented on the active zone. Therefore, with the multiple-cycle command signals being generated repeatedly, the multiple-cycle command signals would fill up the portion of the shifters from entry to exit.

In this state, referring back to FIG. 1, the logic level is transitioned by the DLL circuit 17, in the current embodiment, from high to low, but is not limited as such. Then, the logic level is sent to the And circuit to disable the clock signal entering into the output control logic circuit 19. Meanwhile, the shifters of the active zone 43 would be frozen.

Moreover, the shifters of the active zone 43 would be kept frozen until a command having "gap" information is received by the command decoding circuit 15. In this state, referring back to FIG. 1, the logic level would be transitioned, in the current embodiment, from low to high but not limited, by the command decoding circuit 15 and sent, via the command extension circuit 11, the DLL circuit 17 and the control logic circuit 19, to the And circuit for enabling the clock signal entering into the output control logic circuit 19.

Figure 5:
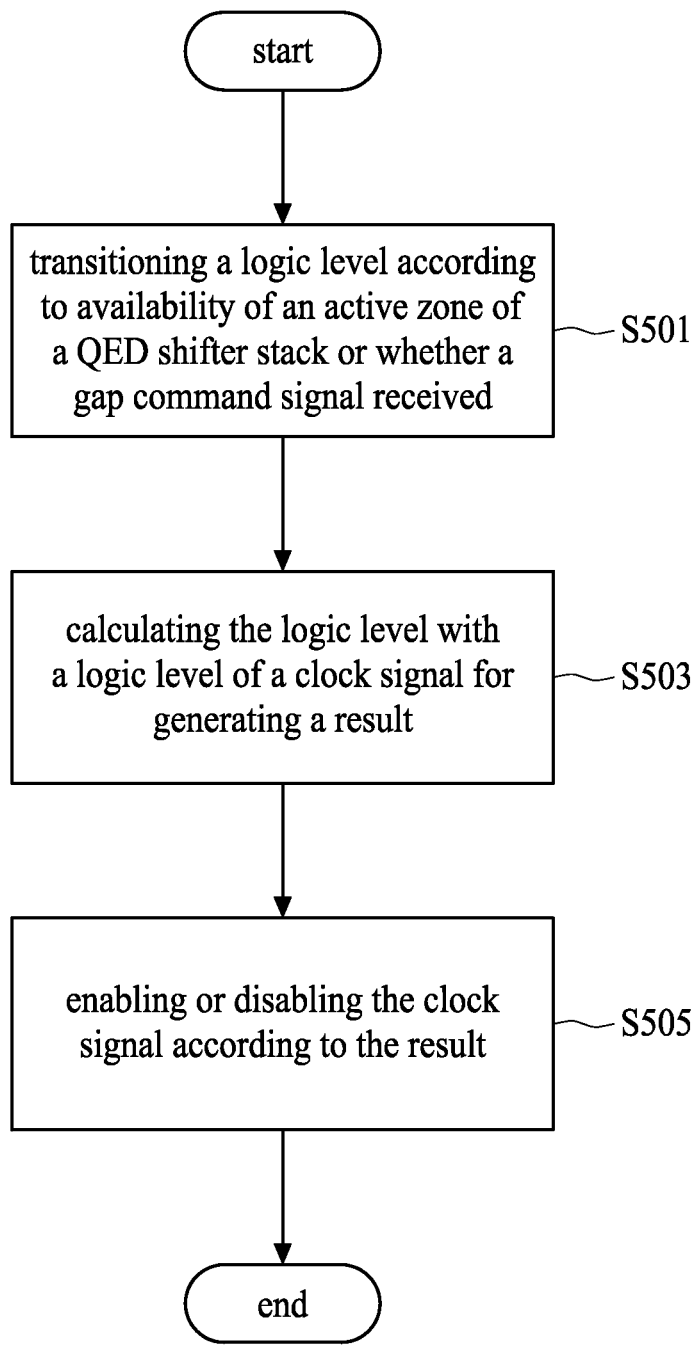
FIG. 5 shows a flow chart of a method for current and area saving in dynamic random access memory devices of one embodiment of the present invention.

FIG. 5 shows a flow chart of a method for clock control in dynamic random access memory devices of one embodiment of the present invention.

As shown in FIG. 5, in the step S501, a logic level would be transitioned according to availability of an active zone of a QED shifter stack, or whether a gap command signal is received. In step S503, the logic level would be calculated with a logic level of a clock signal by an And logical operation for generating a result.

In step S505, the clock signal would be enabled or disabled according the result, wherein the clock signal would be enabled while a multiple-cycle command having "gap" information is received by a command decoding circuit, wherein the clock signal would be disabled while an active zone of a QED shifter stack of a DLL circuit is filled up with multiple-cycle commands.

Moreover, the QED shifter stack comprises a plurality of shifters and the active zone comprises a portion of the shifters, wherein a first-in-first-out (FIFO) algorithm is implemented on the active zone.

Although the current disclosure and its objectives have been described in detail, it should be understood that various changes, substitutions and alterations can be made herein without departing from the spirit and scope of the disclosure as defined by the appended claims. For example, many of the processes discussed above can be implemented using different methodologies, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the current disclosure, processes, machines, manufacture, compositions of matter, means, methods, or steps, presently existing or later to be developed, that perform substantially the same function or achieve substantially the same result as the corresponding embodiments described herein may be utilized according to the current disclosure. As such, the appended claims are intended to include within their scope such processes, machines, manufacture, compositions of matter, means, methods, or steps.

What is claimed is:

1. A circuit in dynamic random access memory devices, comprising:
   a command extension circuit configured to generate at least one multiple-cycle command signal by lengthening a single-cycle command signal from a command decoding circuit;
   wherein the command extension circuit further comprises:
   a first flip-flop coupled to the command decoding circuit, a second flip-flop and a first Or circuit, wherein the first flip-flop generates a first delay signal according to the single-cycle command signal from the command decoding circuit and sends the first delay signal to the second flip-flop and the first Or circuit; and
   a third flip-flop coupled to a second Or circuit, the second flip-flop and the first Or circuit, wherein the third flip-flop generates a third delay signal according to a second delay signal from the second flip-flop and a reset signal from a second Or circuit and sends the third delay signal to the first Or circuit;
   wherein the second delay signal is generated by the second flip-flop according to the first delay signal and the reset signal;
   wherein the reset signal is generated by the second Or circuit according to a burst length signal and an output signal of a second And circuit;
   wherein the output signal is generated by the second And circuit according to an A12 signal and a burst chop signal;
   wherein the first Or circuit is configured to generate the multiple-cycle command signal to a delay lock loop (DLL) circuit according to the first delay signal, the second delay signal, the third delay signal and the single-cycle command signal.

2. The circuit of claim 1, wherein the single-cycle command signal comprises a gap command signal.

3. The circuit of claim 1, wherein the command extension circuit output the at least one multiple-cycle command signal to the DLL circuit.

4. The circuit of claim 3, further comprising a first And circuit configured to determine whether a clock signal is allowed to enter into an output control logic circuit according to a logic level generated by the DLL circuit or the command decoding circuit.

5. The circuit of claim 1, further comprising a flip-flop configured to cut the burst length signal from four clocks to two clocks.

6. The circuit of claim 4, wherein the output control logic circuit further comprises a dQ-Enable-Delay (QED) shifter stack, and the QED shifter stack comprises a plurality of shifters, wherein an active zone comprises a portion of the shifters.

7. The circuit of claim 6, wherein a first-in-first-out (FIFO) algorithm is implemented on the active zone.

\* \* \* \* \*